United States Patent [19]

Koontz et al.

[11] 4,077,852

[45] Mar. 7, 1978

[54] SELECTIVE GOLD PLATING

[75] Inventors: Donald Eldridge Koontz, Summit; Peter Kenny Skurkiss, Short Hills, both of N.J.

[73] Assignee: Bell Telephone Laboratories, Incorporated, Murray Hill, N.J.

[21] Appl. No.: 766,897

[22] Filed: Feb. 9, 1977

[51] Int. Cl.² ............................................. C25D 5/02
[52] U.S. Cl. ................................................... 204/15
[58] Field of Search .............................. 204/15, 18 R

[56] References Cited

U.S. PATENT DOCUMENTS

| | | | |
|---|---|---|---|
| 1,857,929 | 5/1932 | McFarland | 204/18 R |
| 1,862,231 | 6/1932 | McFarland | 204/18 R |
| 3,523,067 | 8/1970 | Baird-Kerr et al. | 204/15 |
| 3,625,844 | 12/1971 | McKean | 204/140 |
| 3,632,389 | 1/1972 | Vazirani | 204/51 |
| 3,937,638 | 2/1976 | Plewes | 148/12.7 |

OTHER PUBLICATIONS

Metal Finishing, Sept. 1975, pp. 29–35.
Journal of Electrochemical Society, vol. 120, No. 6, June 1973, pp. 735–738.

*Primary Examiner*—T. M. Tufariello
*Attorney, Agent, or Firm*—Walter G. Nilsen

[57] ABSTRACT

A process is described for selectively electroplating gold on metallic surfaces containing copper using a chromate film as a plating mask. This procedure permits reduced use of gold without adversely affecting device performance. In addition, chromate films may be patterned with relatively high dimensional resolution and control so as to achieve gold plating patterns useful in electronic and integrated circuits.

9 Claims, 3 Drawing Figures

SELECTIVE GOLD PLATING

BACKGROUND OF THE INVENTION

1. Field of the Invention

The invention involves a procedure for electroplating gold.

2. Description of the Prior Art

Gold electroplating processes have many important industrial applications. Gold is extensively used in electronic and integrated circuits both because of its high electrical conductivity and its inert chemical properties. Gold is also extensively used on contact surfaces in connectors, switches and electronic circuits. Because of the extensive use of gold in electrical circuits and its relatively high cost, it is advantageous to conserve as much as possible the amount of gold used in a particular application without sacrificing device performance.

Various masking procedures have been used in the past to limit the area in which gold plating takes place. At present, it is highly desirable to have a masking procedure which can be carried out rapidly, is adaptable to industrial manufacturing procedures and is also capable of high dimensional resolution and control. Such a procedure would be highly advantageous economically both because of the reduced cost of gold used and because of lower manufacturing cost.

SUMMARY OF THE INVENTION

The invention is a process for selectively electroplating gold on metallic surfaces using a chromate film as a plating mask. A variety of metallic surfaces are useful but metallic surfaces containing copper (brass, beryllium copper, phosphor bronze, copper-nickel-tin alloys, some of which are described in U.S. Pat. No. 3,937,638, etc.) are particularly important because of extensive use. For many applications, the metal should contain at least 20 percent by weight of copper. Other applications require at least 90 percent by weight or even 98 percent by weight of copper. Gold plating conditions under which chromate films act as a mask vary depending on chromate film thickness, metallic surface, etc. Generally, gold plating conditions should be more moderate (lower temperature, voltage, etc.) than ordinarily used so that typical chromate films will act as an effective mask for gold electroplating. A typical gold electroplating procedure for ordinary chromate films involves use of a citrate buffered gold electroplating solution, a low current density (usually less than 5 ASF), and lower temperatures (generally room temperature) than that ordinarily used. This procedure not only permits rapid and efficient plating of gold in certain designated areas without wasteful gold plating in areas where gold is not required, but also allows gold platings in patterns for various applications.

DETAILED DESCRIPTION

Figure 1:
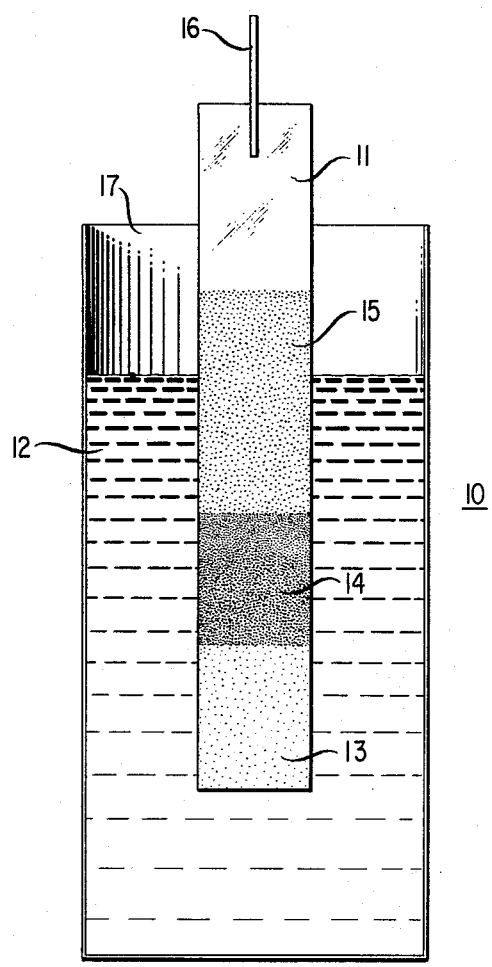
FIG. 1 is a side view of an experimental setup for testing the masking quality of chromate films in gold electroplating procedures.

The invention is a process for selectively electroplating gold on metallic surfaces in which a chromate film is used as a mask to prevent gold plating in certain areas. Although the exact nature and composition of chromate films is not known, it is believed to be chromium oxide or oxides, generally with the chromium in a more or less high oxidation state. The chromate film may be laid down on the metallic surface using a variety of processes, some of which are well known in the art. It is observed that certain procedures for producing chromate film yield a chromate film which acts as a mask only under specific gold plating conditions. It is believed that such chromate film may be thinner and less dense than other chromate films which continue to act as a mask under more vigorous gold plating conditions.

Typical chromating procedures are described in a variety of references including "Chromate Conversion Coatings" by F. W. Eppensteiner and M. R. Jenkins in *Metal Finishing*, September, 1975, page 29; "A Study of Surface Chromium on Tinplate" by S. E. Rauch, Jr. and R. N. Steinbicker, in *Journal of Electrochemical Society*, Vol. 120, No. 6, June, 1973, page 735; and U.S. Pat. No. 3,625,844 issued to Walter A. McKean. Chromating procedures are also described by H. N. Vazirani in U.S. Pat. No. 3,632,389, issued Apr. 3, 1968.

A typical procedure is now described. The copper-containing metal (for example, phosphor bronze) is first surface cleaned if required. Typically, the surface is immersed in boiling trichloroethylene for 5 minutes, air dried and immersed in an alkaline cleaner at approximately 65° C for 4 minutes. The material is then rinsed in water and acid cleaned for 3 minutes. The material surface is then rinsed in water and dried with nitrogen gas. A more complete description of cleaning and degreasing methods may be found in the literature; see for example Protective Coatings for Metals, Third Edition, *American Chemical Society*, Monograph 163 by R. M. Burns and W. W. Bradley, pages 27 to 54, Reinhold (1967). The chromate film is cathodically deposited using a 5% potassium dichromate solution (pH approximately 3.7) at room temperature. The current density is approximately 90 amperes per square foot (ASF) and the time of electrolysis is approximately 3 to 15 seconds. The chromate films may be patterned in a variety of ways so as to act as a mask to prevent gold plating in particular areas. The entire metal surface may be coated with chromate film and then the film removed by abrasion or machining, etc., or by cutting the metal work in certain areas. Prior to putting down the chromate film certain areas may be masked by use of organic films such as stop-off lacquer or photoresist material. In fact, rather intricate patterns may be observed by use of the photolithographic procedures well known in the integrated circuit technology using various kinds of photoresist material. Various other patterning procedures for making chromate films on metal surfaces with various patterns may also be used.

Some care must be used in carrying out the gold electroplating procedure. In most gold plating applications it is often desirable to use somewhat severe conditions so as to maximize plating speed and adherence of the gold plated layer to the substrate. Some of these gold plating conditions sometimes have to be modified to insure that the chromate film acts as a gold plating mask.

For the best chromate films a large variety of gold plating procedures may be used. Such gold plating procedures have been described in many references including Gold Plating Technology by F. H. Reid and W. Goldie, *Electrochemical Publications Limited,* 1974, and *Modern Electroplating* edited by F. W. Lowenheim, 2nd edition, Wiley, New York, 1963.

Some typical compositions for electroplating solutions are given below. These electroplating procedures may be carried out at room temperature unless otherwise indicated.

| 1. Hard Gold | |
|---|---|
| Potassium gold cyanide KAu (CN)$_2$ | 12–46 gm/l |
| Citric acid anhydrous | 80–120 gm/l |
| KOH | 4–6 gm/l |
| Cobalt citrate | 100–200 ppm |
| 2. Hard Gold | |
| Potassium gold cyanide | 12–46 gm/l |
| Phosphoric acid to adjust pH to approximately 4.2 | |
| Cobalt citrate | 100–200 ppm |
| 3. Soft Gold | |
| Potassium gold cyanide | 12–46 gm/l |
| Potassium hydrogen phosphate | 40 gm/l |
| Potassium dihydrogen phosphate | 10 gm/l |
| This yields a solution with pH approximately 7.0 and plating should be carried out at a temperature of approximately 65 degrees C. | |
| 4. Soft Gold | |
| Potassium gold cyanide (NH$_4$)$_2$ HC$_6$H$_5$O$_7$ | 20 gm/l |
| pH 5 – 6.5 plating temperature approximately 65 degrees C. | |

For best results, particularly in the sharpness with which the chromate film acts as a mask, a citrate gold plating bath should be used. The composition which may vary by ± 20 percent without deleterious effects is as follows: 20 grams per liter potassium gold cyanide and 50 grams per liter dibasic ammonium citrate. Although this bath may be, and is, generally designed to operate at approximately 65° C, room temperature operation is sometimes preferred where the chromate film is thin and of poor quality. Current densities are in the range from 2 to 5 ASF. Lower current densities can be used but it is generally wasteful of time. Higher current densities may, under certain conditions, decrease the masking capabilities of the chromate film.

A particular example may serve to illustrate the invention. A copper coupon of approximate size 1 inch by 0.5 inch was degreased by a ten minute immersion in boiling trichloroethylene. These copper coupons were activated for chromating by immersion in a cleaning solution for one minute. A chromate film was put down on the coupons by immersing them in a 5 percent potassium dichromate solution at room temperature and applying a 300 ASF cathodic current for 60 seconds. After this treatment the coupons were thoroughly rinsed and dried.

A strip pattern was generated on each coupon using stop-off lacquer and a concentrated hydrochloric acid solution as etchant. Part of the coupon was coated with stop-off lacquer and the entire coupon exposed to concentrated hydrochloric acid solution in order to etch away the chromate film not protected by the stop-off lacquer. After etching, the lacquer was removed with acetone.

The copper coupons were then exposed to a gold plating procedure. The coupons were put in a citrate gold plating bath with the following composition: 20 grams per liter KAu (CN)$_2$ and 50 grams per liter dibasic ammonium citrate. The gold plating procedure was carried out at room temperature and current densities between 1 and 5 ASF. It was observed that the thin chromate film effectively functioned as a plating mask for gold plating under these conditions.

FIG. 1 shows a drawing of the copper strip in the gold plating solution. The experimental setup 10 has the copper foil 11 immersed in the gold plating solution 12 in which some of the foil has exposed copper 13 and copper with chromate film 14 and copper with stop-off lacquer 15. Here, only part of the stop-off lacquer was removed to expose the area 14 with chromate film. The copper foil also has a tab for electrical connection 16 together with a glass jar 17. On gold plating in accordance with the invention, gold plates on the area free of chromate film 13 but not on the area with chromate film 14. This demonstrates that the chromate film is the effective mask for gold plating.

Electrical connectors may also be made in accordance with the inventive procedure. A particular example may be instructive in illustrating the invention. The metallic part of the electrical connector is made from phosphor bronze. This metallic part comes from a long strip of phosphor bronze material which is chromated cathodically prior to being cut into the final connector pieces. After preconditioning and cleaning the surface as described above, the chromate film is cathodically deposited using a 5 percent potassium dichromate solution (pH approximately 3.7) at room temperature. The phosphor bronze is used as the cathode and a piece of platinum is used as the anode. The distance between the anode and cathode is generally about 1½ inches. Multiple chromating procedures may be used to increase the integrity and thickness of the chromate film and to insure that the entire surface is covered with chromate film.

After the phosphor bronze strip is chromated, the metallic connector pieces are cut out in accordance with the well known manufacturing procedures. This leaves part of the surface of the metallic connector piece free of chromate film. The metallic connector pieces are then gold plated using a conventional citrate buffered gold plating bath at room temperature and a current density between 2 to 5 ASF. Only the surfaces which are cut after the chromating procedure obtain a gold plating. The remainder of the surface of the metal connector part is not gold plated because of the effective masking quality of the chromate film.

Figure 2:
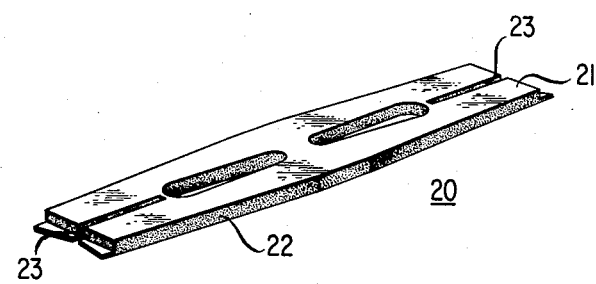
FIG. 2 shows the metallic portion of a multichannel electrical connector including surfaces which are masked and surfaces which are electroplated with gold.

FIG. 2 shows such a metallic connector part 20 with unplated surface 21 and gold plated surface 22. This procedure drastically reduces the amount of gold used in making such metallic connector parts without affecting device performance since the metal contact occurs on that part of the surface 23 which is gold plated.

Figure 3:
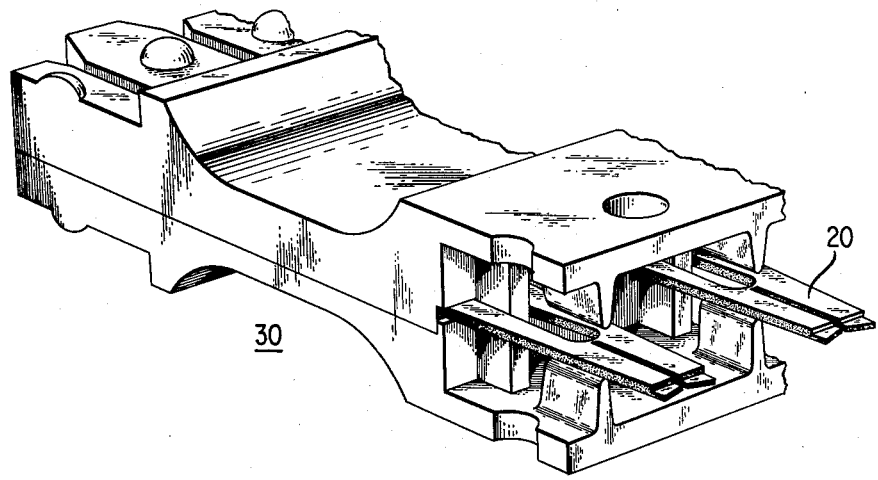
FIG. 3 shows a portion of an electrical connector incorporating the metallic connector with gold plating shown in FIG. 2.

FIG. 3 shows a part of a multiple circuit connector 30 with individual metallic connector parts 20.

What is claimed is:

1. A process for selectively electroplating gold on metallic surfaces containing at least 20 weight percent copper in which part of the metallic surface is covered with a chromate film comprising the step of:

(a) exposing the patterned metallic surface to a gold electroplating procedure so that the chromate film acts as a mask to gold electroplating and gold is electroplated on the unchromated part of the metallic surface.

2. The process of claim 1 in which the gold electroplating procedure involves use of a citrate buffered gold plating solution.

3. The process of claim 2 in which the gold electroplating procedure employs a current density less than 5 ASF.

4. The process of claim 2 in which the gold electroplating procedure is carried out at approximately room temperature.

5. The process of claim 1 in which the chromate film is cathodically deposited using a potassium dichromate solution.

6. The process of claim 1 in which the patterned chromate film is made by first chromating a surface and then removing chromate film.

7. The process of claim 1 in which the patterned chromate film is made by first masking a portion of the metallic surface with masking material chromating the remainder of the surface and removing the masking material.

8. The process of claim 1 in which the patterned chromate film is made by first chromating the metallic surface and then cutting into the metal surface to create new, unchromated surface.

9. The process of claim 1 in which the gold plated surface forms part of an electrical contact.

* * * * *